(12) United States Patent  
Kundu (10) Patent No.: US 7,049,846 B1  
(45) Date of Patent: *May 23, 2006

(54) CLOCK TREE NETWORK IN A FIELD PROGRAMMABLE GATE ARRAY

(75) Inventor: Arunangshu Kundu, San Jose, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/916,926

(22) Filed: Aug. 11, 2004

Related U.S. Application Data (63) Continuation of application No. 10/448,258, filed on May 28, 2003, now Pat. No. 6,825,690.

(51) Int. Cl.  
*H03K 19/177* (2006.01)

(52) U.S. Cl. ............... 326/41; 326/40; 326/47; 326/101; 327/141; 327/144; 327/150; 327/156

(58) Field of Classification Search ............... 326/41, 326/47, 101, 40; 327/141, 144, 150, 156  
See application file for complete search history.

(56) References Cited

U.S. PATENT DOCUMENTS

| | | | | |
|---|---|---|---|---|
| 4,255,748 A | 3/1981 | Bartlett | ............... | 340/661 |
| 4,625,313 A | 11/1986 | Springer | ............... | 371/20 |
| 4,638,187 A | 1/1987 | Boler et al. | ............... | 307/451 |
| 4,638,243 A | 1/1987 | Chan | ............... | 324/51 |
| 4,684,830 A | 8/1987 | Tsui et al. | ............... | 307/465 |
| 4,700,130 A | 10/1987 | Bloemen | ............... | 324/110 |
| 4,706,216 A | 11/1987 | Carter | ............... | 365/94 |
| 4,713,557 A | 12/1987 | Carter | ............... | 307/242 |
| 4,717,912 A | 1/1988 | Harvey et al. | ............... | 340/825.83 |
| 4,718,042 A | 1/1988 | Moll et al. | ............... | 365/201 |
| 4,742,252 A | 5/1988 | Agrawal | ............... | 307/465 |
| 4,772,812 A | 9/1988 | Desmarais | ............... | 307/473 |

(Continued)

FOREIGN PATENT DOCUMENTS

EP     0 415 542 A2     6/1991

(Continued)

OTHER PUBLICATIONS

L. Ashby, "ASIC Clock Distribution using a Phase Locked Loop (PLL)", *Proceedings Fourth Annual IEEE International ASIC Conference and Exhibit*, pp. 6.1-6.3, Sep. 1991.

(Continued)

*Primary Examiner*—Vibol Tan  
(74) *Attorney, Agent, or Firm*—Sierra Patent Group, Ltd.

(57) ABSTRACT

A clock tree distribution network for a field programmable gate array comprises an interface with a root signal chosen from at least one of an external clock signal, an internal clock signal, a plurality of phase lock loop cell output signals and programmable elements. The FPGA includes a logic array with programmable elements coupling the logic array to a programmable routing architecture and the interface. A routed clock network selects a signal from a clock signal from the interface, a local signal from the logic array through the routing architecture, Vcc or ground, and routes the selected signal to the logic array through the clock tree distribution network. A hardwired clock network selects a signal from a clock signal from the interface or a local signal from the routing architecture, and routes the selected signal to a plurality of flip-flops in the logic array through the clock tree distribution network.

8 Claims, 9 Drawing Sheets

U.S. PATENT DOCUMENTS

| | | | |
|---|---|---|---|
| 4,800,176 A | 1/1989 | Kakumu et al. | 437/193 |
| 4,857,774 A | 8/1989 | El Ayat et al. | 307/465 |
| 4,870,300 A | 9/1989 | Nakaya et al. | 307/303 |
| 4,870,302 A | 9/1989 | Freeman | 307/465 |
| 4,873,459 A | 10/1989 | El Gamal et al. | 307/465 |
| 4,928,023 A | 5/1990 | Marshall | 307/443 |
| 4,930,097 A | 5/1990 | Ledenbach et al. | 364/716 |
| 4,935,645 A | 6/1990 | Lee | 307/362 |
| 4,959,561 A | 9/1990 | McDermott et al. | 307/443 |
| 4,978,905 A | 12/1990 | Hoff et al. | 323/314 |
| 5,008,855 A | 4/1991 | Eltoukhy et al. | 365/96 |
| 5,046,035 A | 9/1991 | Jigour et al. | 364/716 |
| 5,083,083 A | 1/1992 | El-Ayat et al. | 324/158 R |
| 5,121,394 A | 6/1992 | Russell | 371/72.1 |
| 5,122,685 A | 6/1992 | Chan et al. | 307/465.1 |
| 5,126,282 A | 6/1992 | Chiang et al. | 437/172 |
| 5,132,571 A | 7/1992 | McCollum et al. | 307/465.1 |
| 5,144,166 A | 9/1992 | Camarota et al. | 307/465.1 |
| 5,187,392 A | 2/1993 | Allen | 307/465 |
| 5,198,705 A | 3/1993 | Galbraith et al. | 307/465 |
| 5,208,491 A | 5/1993 | Ebeling et al. | 307/465 |
| 5,220,213 A | 6/1993 | Chan et al. | 307/465 |
| 5,220,215 A | 6/1993 | Douglas et al. | 307/465 |
| 5,221,865 A | 6/1993 | Phillips et al. | 307/465 |
| 5,222,066 A | 6/1993 | Grula et al. | 371/21.1 |
| 5,258,319 A | 11/1993 | Inuishi et al. | 437/35 |
| 5,272,388 A | 12/1993 | Bakker | 307/202.1 |
| 5,286,992 A | 2/1994 | Ahrens et al. | 257/356 |
| 5,293,133 A | 3/1994 | Birkner et al. | 324/713 |
| 5,300,830 A | 4/1994 | Hawes | 307/465 |
| 5,300,832 A | 4/1994 | Rogers | 307/475 |
| 5,317,698 A | 5/1994 | Chan | 395/325 |
| 5,365,485 A | 11/1994 | Ward et al. | 365/221 |
| 5,367,207 A | 11/1994 | Goetting et al. | 307/465 |
| 5,375,089 A | 12/1994 | Lo | 365/189.04 |
| 5,394,033 A | 2/1995 | Tsui et al. | 326/41 |
| 5,394,034 A | 2/1995 | Becker et al. | 326/39 |
| 5,396,128 A | 3/1995 | Dunning et al. | 326/68 |
| 5,397,939 A | 3/1995 | Gordon et al. | 326/38 |
| 5,399,920 A | 3/1995 | Van Tran | 326/83 |
| 5,400,262 A | 3/1995 | Mohsen | 364/489 |
| 5,430,335 A | 7/1995 | Tanoi | 327/170 |
| 5,430,687 A | 7/1995 | Hung et al. | 365/230.08 |
| 5,469,003 A | 11/1995 | Kean | 326/39 |
| 5,469,396 A | 11/1995 | Eltoukhy | 365/210 |
| 5,473,268 A | 12/1995 | Declercq et al. | 326/80 |
| 5,485,103 A | 1/1996 | Pedersen et al. | 326/41 |
| 5,486,775 A | 1/1996 | Veenstra | 126/38 |
| 5,526,312 A | 6/1996 | Eltoukhy | 365/201 |
| 5,537,057 A | 7/1996 | Leong et al. | 326/41 |
| 5,546,019 A | 8/1996 | Liao | 326/81 |
| 5,559,464 A | 9/1996 | Orii et al. | 327/333 |
| 5,572,476 A | 11/1996 | Eltoukhy | 365/210 |
| 5,666,322 A | 9/1997 | Conkle | 365/233 |
| 5,670,905 A | 9/1997 | Keeth et al. | 327/333 |
| 5,744,979 A | 4/1998 | Goetting | 326/39 |
| 5,744,980 A | 4/1998 | McGowan et al. | 326/40 |
| 5,801,547 A | 9/1998 | Kean | 326/40 |
| 5,809,281 A | 9/1998 | Steele et al. | 395/497.01 |
| 5,815,003 A | 9/1998 | Pedersen | 326/39 |
| 5,815,004 A | 9/1998 | Trimberger et al. | 326/41 |
| 5,821,776 A | 10/1998 | McGowan | 326/41 |
| 5,825,200 A | 10/1998 | Kolze | 326/38 |
| 5,825,201 A | 10/1998 | Kolze | 326/39 |
| 5,825,202 A | 10/1998 | Tavana et al. | 326/39 |
| 5,825,662 A | 10/1998 | Trimberger | 364/491 |
| 5,828,230 A | 10/1998 | Young | 326/41 |
| 5,828,538 A | 10/1998 | Apland et al. | 361/56 |
| 5,831,448 A | 11/1998 | Kean | 326/41 |
| 5,835,165 A | 11/1998 | Keate et al. | 348/845.1 |
| 5,835,998 A | 11/1998 | Pedersen | 326/40 |
| 5,838,167 A | 11/1998 | Erickson et al. | 326/38 |
| 5,838,584 A | 11/1998 | Kazarian | 364/491 |
| 5,838,954 A | 11/1998 | Trimberger | 395/500 |
| 5,847,441 A | 12/1998 | Cutter et al. | 257/530 |
| 5,847,577 A | 12/1998 | Trimberger | 326/38 |
| 5,848,005 A | 12/1998 | Cliff et al. | 365/230.03 |
| 5,848,006 A | 12/1998 | Nagata | 365/230.06 |
| 5,850,151 A | 12/1998 | Cliff et al. | 326/39 |
| 5,850,152 A | 12/1998 | Cliff et al. | 326/40 |
| 5,850,564 A | 12/1998 | Ting et al. | 395/800.37 |
| 5,852,608 A | 12/1998 | Csoppenszky et al. | 370/465 |
| 5,854,763 A | 12/1998 | Gillingham et al. | 365/189.04 |
| 5,859,542 A | 1/1999 | Pedersen | 326/39 |
| 5,859,543 A | 1/1999 | Kolze | 326/41 |
| 5,859,544 A | 1/1999 | Norman | 326/40 |
| 5,861,761 A | 1/1999 | Kean | 326/41 |
| 5,869,981 A | 2/1999 | Agrawal et al. | 326/39 |
| 5,870,586 A | 2/1999 | Baxter | 395/500 |
| 5,880,492 A | 3/1999 | Duong et al. | 257/209 |
| 5,880,512 A | 3/1999 | Gordon et al. | 257/530 |
| 5,880,597 A | 3/1999 | Lee | 326/41 |
| 5,880,598 A | 3/1999 | Duong | 326/41 |
| 5,883,526 A | 3/1999 | Reddy et al. | 326/41 |
| 5,883,850 A | 3/1999 | Lee et al. | 365/230.03 |
| 5,949,719 A | 9/1999 | Clinton et al. | 365/189.01 |
| 5,952,847 A | 9/1999 | Plants et al. | 326/80 |
| 5,994,934 A | 11/1999 | Yoshimura et al. | 327/158 |
| 6,011,744 A | 1/2000 | Sample et al. | 365/230.03 |
| 6,034,677 A | 3/2000 | Noguchi et al. | 345/327 |
| 6,038,627 A | 3/2000 | Plants | 710/126 |
| 6,049,487 A | 4/2000 | Plants et al. | 365/189.04 |
| 6,107,826 A | 8/2000 | Young et al. | 326/41 |
| 6,111,448 A | 8/2000 | Shibayama | 327/293 |
| 6,181,174 B1 | 1/2001 | Fujieda et al. | 327/158 |
| 6,289,068 B1 | 9/2001 | Hassoun et al. | 375/376 |
| 6,292,016 B1 | 9/2001 | Jefferson et al. | 326/39 |
| 6,326,812 B1 | 12/2001 | Jefferson | 326/93 |
| 6,329,839 B1 | 12/2001 | Pani et al. | 326/41 |
| 6,430,088 B1 | 8/2002 | Plants et al. | 365/189.04 |
| 6,437,650 B1 | 8/2002 | Sung et al. | 331/25 |
| 6,441,666 B1 * | 8/2002 | Swanson et al. | 327/291 |
| 6,496,887 B1 | 12/2002 | Plants | 710/100 |
| 6,810,846 B1 * | 11/2004 | Murata et al. | 123/90.36 |
| 6,911,853 B1 * | 6/2005 | Kizer et al. | 327/158 |
| 6,924,684 B1 * | 8/2005 | Nguyen | 327/241 |

FOREIGN PATENT DOCUMENTS

| | | |
|---|---|---|
| EP | 0 415 542 A3 | 10/1991 |
| EP | 0 889 593 A1 | 1/1999 |
| EP | 1 137 188 A2 | 9/2001 |

OTHER PUBLICATIONS

"AV9170 Clock Synchronizer and Multiplier", pp. 1-4, Nov. 8, 1992.

"AV9170 Application Note", AvaSem, pp. 1-7, Jan. 1993.

U. Ko et al., "A 30-ps JITTER, 3.6- µs Locking, 3.3-Volt Digital PLL for CMOS Gate Arrays", *IEEE 1993 Custom Integrated Circuits Conference*, pp. 23.3.1-23.3.4, Conf. Date: May 9-12, 1993.

A. Efendovich et al., "Multi-Frequency Zero-Jitter Delay-Locked Loop", *IEEE 1993 Custom Integrated Circuits Conference*, pp. 27.1.1-27.1.4, Conf. Date: May 9-12, 1993.

R. Quinnell, "Blending gate arrays with dedicated circuits sweetens ASIC development", EDN, pp. 29-32, Mar. 31, 1994.

J. Chen, "PLL-based clock systems span the system spectrum from green PCs to Alpha", EDN, pp. 147-148, 150, 152, 154-155, Nov. 9, 1995.

P. Sevalia, "Straightforward techniques cut jitter in PLL-based clock drivers", EDN, pp. 119-123, 125, Nov. 23, 1995.

D. Bursky, "Memories Hit New Highs And Clocks Run Jitter-Free", Electronic Design, pp. 79-80, 84-85, 89-93, Feb. 19, 1996.

* cited by examiner

CLOCK TREE NETWORK IN A FIELD PROGRAMMABLE GATE ARRAY

CROSS-REFERENCE TO RELATED APPLICATIONS

This application is a continuation of U.S. patent application Ser. No. 10/448,258, filed May 28, 2003 is now a U.S. Pat. No. 6,825,690.

BACKGROUND OF THE SYSTEM

1. Field of the System

The present system relates to field programmable gate array (FPGA) devices. More specifically, the system relates to a clock tree network in an FPGA having a central clock tree distribution cluster that is configured to distribute the root signals from the phase locked loop to the logic clusters through routed clock clusters and hardwired clock clusters.

2. Background

FPGAs are known in the art. An FPGA comprises any number of logic modules, an interconnect routing architecture and programmable elements that may be programmed to selectively interconnect the logic modules to one another and to define the functions of the logic modules. An FPGA is an array of uncommitted gates with uncommitted wiring channels. To implement a particular circuit function, the circuit is mapped into an array and the wiring channels' appropriate connections are programmed to implement the necessary wiring connections that form the user circuit.

A field programmable gate array circuit can be programmed to implement virtually any set of functions. Input signals are processed by the programmed circuit to produce the desired set of outputs. Such inputs flow from a user's system, through input buffers and through the circuit, and finally back out the user's system via output buffers. Such buffers may provide any or all of the following input/output (I/O) functions: voltage gain, current gain, level translation, delay, signal isolation or hysteresis.

An FPGA core tile may be employed as a stand alone FPGA, repeated in a rectangular array of core tiles, or included with other devices in a system-on-a-chip (SOC). The core FPGA tile may include an array of logic modules, and input/output modules. An FPGA core tile may also include other components such as read only memory (ROM) modules. Horizontal and vertical routing channels provide interconnections between the various components within an FPGA core tile. Programmable connections are provided by programmable elements between the routing resources.

The programmable elements in an FPGA can be either one-time programmable or re-programmable. Re-programmable elements used in FPGA technologies may comprise transistors or other re-programmable elements as is well known to those of ordinary skill in the art. One-time programmable elements used in FPGA technologies may comprise antifuse devices.

As FPGAs grow in size, on-chip clock distribution becomes increasingly important. Clock skew and clock delay impact FPGA performance and the task of managing clock skew and clock delay with conventional clock trees becomes more difficult in large FPGAs. As such, in large, fast FPGAs, the performance limiting element is often clock delay due to large clock networks. Phase locked loops (PLLs) are used to reduce the clock delays inherent in large FPGAs and, thereby improve performance.

There is a need in the art for a clock network that has the ability to interject an internal signal into the root of the distribution tree, at the center of any tile or per tile row or tile column of logic clusters. There is also a need for a clock network that has the ability to shut off power on unused portions of the clock tree. In addition, there is a need for a clock network that has the ability to balance skew among all points within the clock network.

SUMMARY OF THE SYSTEM

A clock tree distribution network for a field programmable gate array comprises an interface that has a root signal chosen from at least one of an external clock signal, an internal clock signal, a plurality of phase lock loop cell output signals and programmable elements. The FPGA includes a logic array that has programmable elements coupling the logic array to a programmable routing architecture and the interface.

A routed clock network selects a signal from between a clock signal from the interface, a local signal from the logic array through the routing architecture, Vcc or ground, and routes the selected signal to the logic array through the clock tree distribution network. A hardwired clock network that selects a signal from between a clock signal from the interface and a local signal from the routing architecture, and routes the selected signal to a plurality of flip-flops in the logic array through the clock tree distribution network.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE DRAWINGS

Those of ordinary skill in the art will realize that the following description of the present invention is illustrative only and not in any way limiting. Other embodiments of the invention will readily suggest themselves to such skilled persons.

Figure 1:
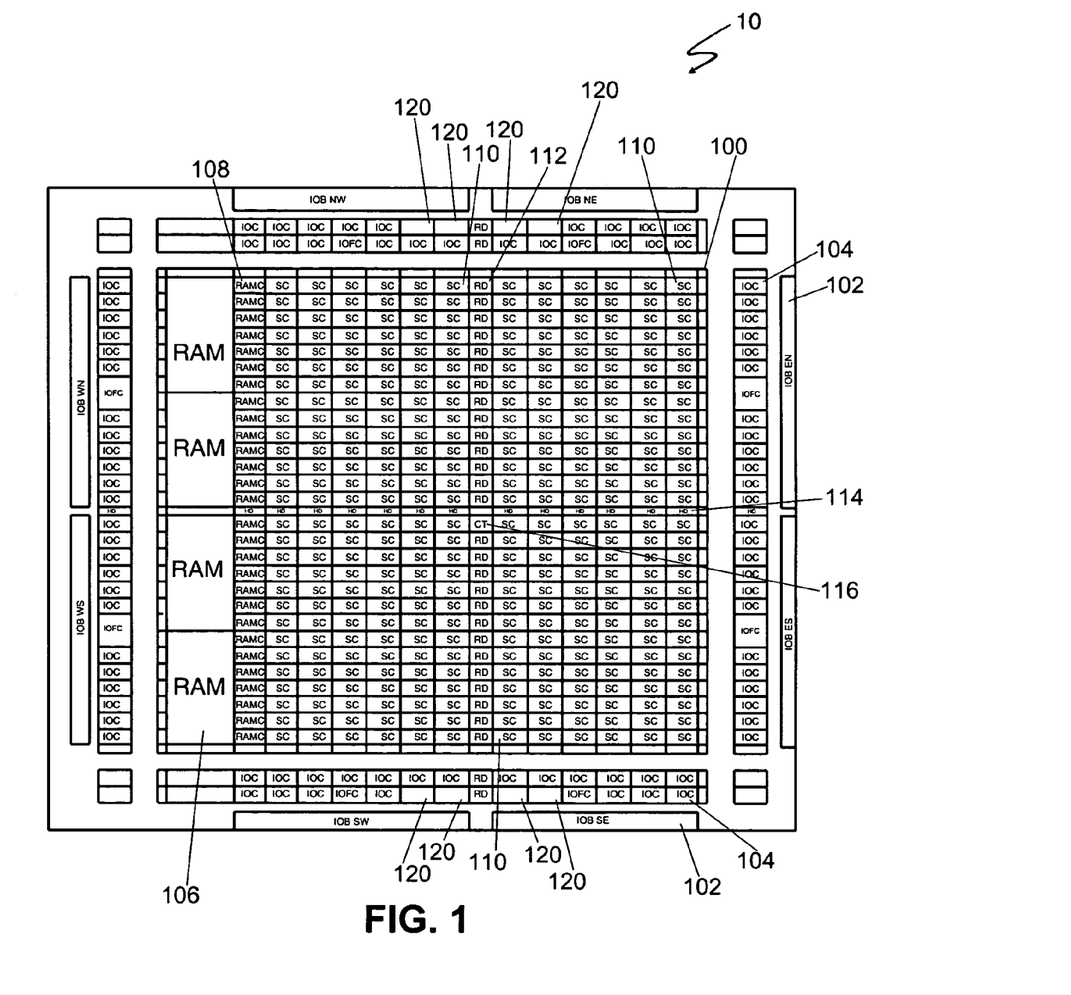
FIG. 1 is a simplified block diagram of an FPGA core tile 100 as disclosed in the present system.

FIG. 1 is a simplified block diagram of an FPGA 10 having one core tile 100 incorporating the clock tree network (not shown), as disclosed in the present system. As shown in FIG. 1, core tile 100 comprises an array of logic clusters 110 arranged in rows and columns. As would be apparent to one of ordinary skill in the art, logic clusters 110 further comprise various logic components such as logic modules and flip-flops (not shown). Core tile 100 also comprise a column of routed clock clusters 112, a row of hard-wired clock clusters 114, a clock tile cluster 116, a column of RAM clusters 108 and RAM memory 106. FPGA core tile 100 is surrounded by two rows of input/output (I/O) clusters 104 and I/O banks 102. On the north and south edges surrounding FPGA core tile 100 there are eight phase-locked-loop clusters (PLL clusters) 120. Four PLL clusters 120 are located on the north edge of FPGA core tile 100 and four PPL clusters 120 are located on the southern edge of FPGA core tile 100. The eight PLL clusters 120 located on the northern and southern edges of FPGA core tile 100 replace eight I/O clusters 104. PLL clusters 120 are coupled to two I/O pads located in I/O banks 102. The interface between PLL clusters 120 and I/O banks 102 will be discussed in greater detail below.

Figure 2:
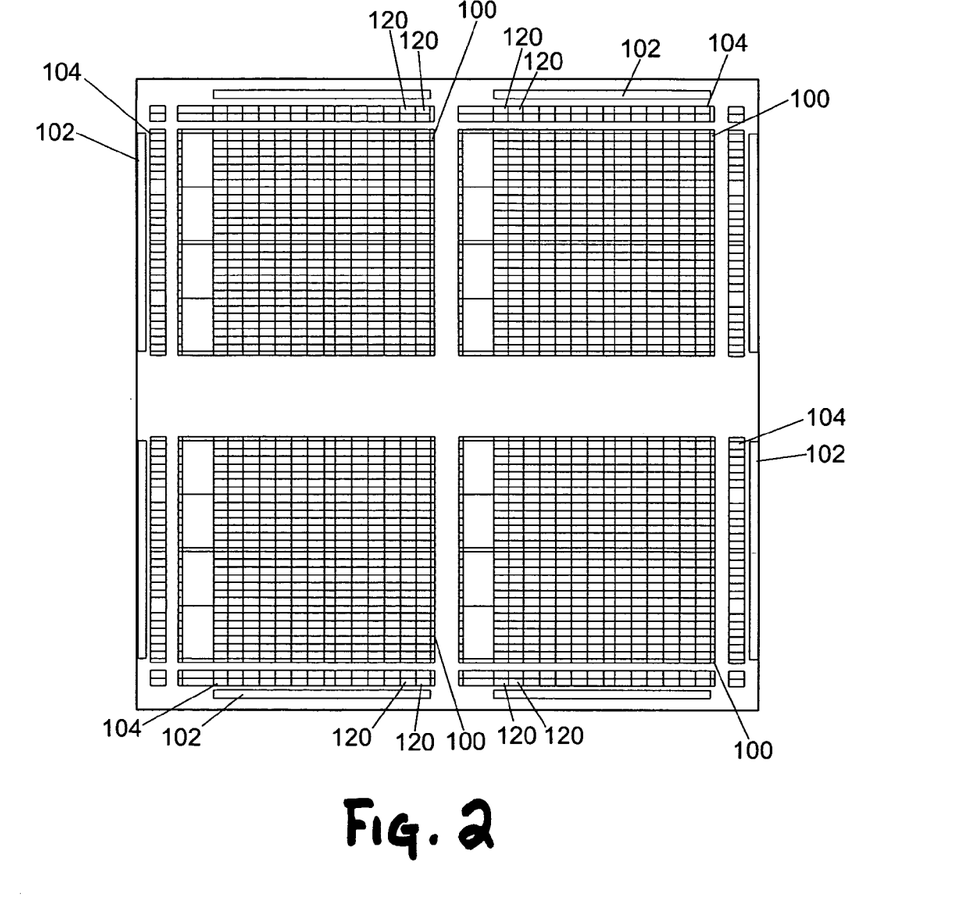
FIG. 2 is a block diagram of an illustrative FPGA including multiple core tiles 100 as shown as an example in FIG. 1.

FIG. 2 is a block diagram of an illustrative FPGA 10 including multiple core tiles 100 as shown as an example in FIG. 1. As shown in FIG. 2, FPGA device comprises four core tiles 100, though other numbers of tiles are possible. Core tiles 100 are surrounded by I/O clusters 104, PLL clusters 120 and I/O banks 102.

Figure 3:
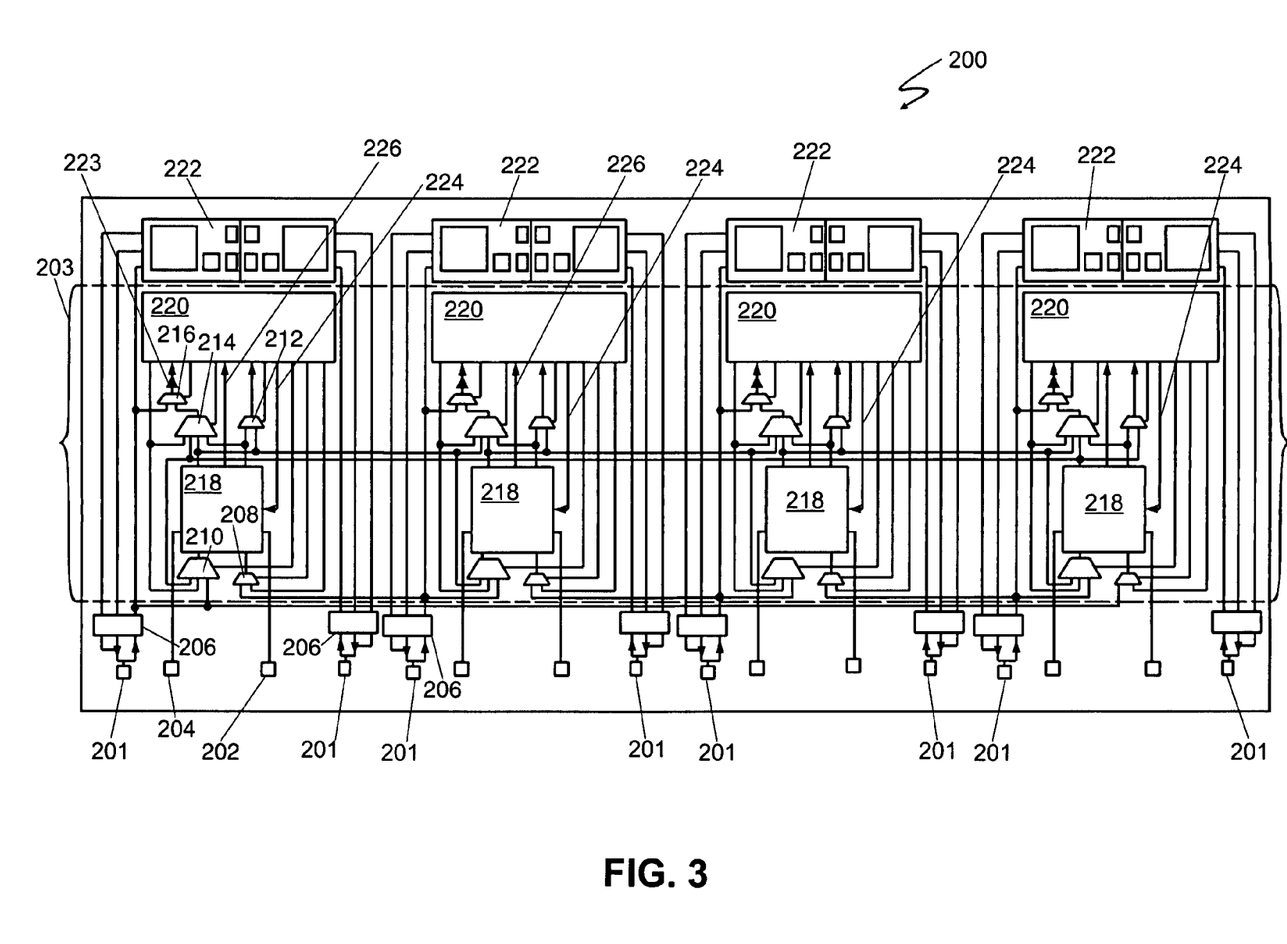
FIG. 3 is a simplified schematic diagram showing the PLL interface with the PLL clusters of the present system.

FIG. 3 is a simplified schematic diagram 200 showing the PLL interface 203 with the I/O clusters 222 of the present system. PLL interface 203 comprises PLL cluster 224, PLL cell 218 and a plurality of selection circuits 208, 210 212, 214 and 216. PLL interface is discussed in greater detail below. As illustrated in FIGS. 1 and 2, four PLL clusters 120 are located adjacent to each other around the median on first and second edges of FPGA core tile 100.

Referring back to FIG. 3, each PLL cell 218 is coupled to two I/O pads 201. I/O pad 201 is coupled to PLL cell 218 through a boundary scan register (BSR) 206, output buffer 203 and input buffer 205. The function of the BSR 206 is to test the circuit to determine if it performs as programmed as is well known to those of ordinary skill in the art.

In addition, I/O pad 201 may be coupled to PLL cell 218 though a plurality of selection circuits. As shown in FIG. 3, for illustrative purposes only, I/O pad is coupled to PLL cell 218 through selection circuits 208 and 210. As those skilled in the art having the benefit of this disclosure will readily realize, any number of selection circuits may be employed or not employed to coupled I/O pads 201 to PLL cell 218. PLL cells 218 are selectively coupled to PLL cluster 220 through selection circuits 212, 214 and 216. As those skilled in the art having the benefit of this disclosure will readily realize, any number of selection circuits may be employed or not employed to couple PLL cluster 220 to PLL cell 218. Coupling PLL cell 218 to I/O pads 200 and PLL cluster 220 through selection circuits 208, 210, 212, 214 and 216 allows for greater signal-selection flexibility. Selection circuits 208, 210, 212, 214 and 216 allow for different input signals to be received through PLL cell 218 from different ones of PLL clusters 220. Selection circuits 208, 210, 212, 214 and 216 also allow for the routing of output signals from PLL cell 218 to adjacent PLL clusters 220.

Two routing buses connect PLL cell 218 directly to PLL cluster 220. Routing bus 226 connects an output of PLL cell 218 directly to PLL cluster 220. Routing bus 224 connects an output of PLL cluster 220 directly to PLL cell 218.

The I/O pads 201 attached to a PLL cluster 120 can be configured for regular functions through the inside I/O cluster 104 if they are not required by PLL cluster 120. I/O clusters 104 are beyond the scope of this disclosure and will not be discussed in detail herein. The path to I/O cluster 104 should be gated by control signals to minimize loading on the clock path. I/O pads 201 may also be configured in all modes available to the regular I/O pads 201 in the same I/O bank. In particular, the REFN and REFP pads can be configured into a differential pair.

PLL cells 218 may share a pair of dedicated pads, pad 202 coupled to an analog power supply and pad 204. Pad 204 is coupled to pad 202 through a decoupling capacitor (not shown) to reduce the jitter of the PLL.

In the present invention, there are a predetermined number of hardwired clock networks and a predetermined number of routed clock networks situated on each FPGA core depending on the size of the FPGA core. A hardwired clock network as described in the present invention is defined as a clock network capable of selecting signals (including both clock signals and local signals from the FPGA routing architecture), routing signals through the hardwired clock network and delivering a signal to a flip-flop module in a logic cluster or an I/O cluster as shown in FIGS. 1 and 2. A routed clock network as described in the present invention is defined as a clock network capable of selecting signals (including both clock signals and local signals from the FPGA routing architecture), routing signals through the routed clock network and delivering signals through a programmable element to either a flip-flop module or a logic module in a logic cluster or an I/O cluster as shown in FIGS. 1 and 2.

Hardwired clock networks and routed clock networks are further defined and discussed in greater detail below. In this illustrative example, there are four hard-wired clocks and four routed clocks. In one embodiment of present invention, the PLL interface blocks, four on the northern edge of the FPGA core 10 and four on a second edge of the FPGA core corresponding with the four PLL clusters 120 located on the north edge of FPGA core tile 100 and four PPL clusters 120 located on the southern edge of FPGA core tile 100 as shown in FIG. 1 are the on-chip clocks of the present system forming the root of the clock network.

As will be discussed in detail below, the hardwired clock network and routed clock network may be essentially the same except for their final distribution branch. The final branch of hardwired clock network connects directly to the clock selection circuits of the flip-flop modules in the logic clusters 110 and I/O clusters 104 as shown in FIGS. 1 and 2. The final branch of the routed clock network comprises an additional horizontal track with programmable elements coupling to the input tracks of the logic modules and flip-flop modules in the logic clusters 110 and I/O clusters 104 as shown in FIGS. 1 and 2. The addition of programmable elements to the routed clock network provides more flexibility to the routed clock network to carry non-clock signals to logic modules. The hardwired clock network is faster, however, it only serves as a clock function to the flip-flop modules.

Each PLL cell 218, pair of dedicated pads, pad 202 coupled to an analog power supply and pad 204, and PLL cluster 220 together form a PLL interface block. The PLL interface block has a root output 223 which forms the basis for each of the eight clock tree networks in the FPGA. The root output selects either (1) the external clock-pad signal, (2) the internal signal from the FPGA core, (3) the clock 1 signal of the PLL of the PLL interface block, (4) the clock 2 signal of the PLL interface block, or (5) the clock 2 signal in the adjacent PLL interface block as the root output signal for the clock network.

For example, arrow 223 indicates where the root signal is inserted and the clock tree network of the present invention begins. Multiple signals may be chosen as the root signal. The root signal may come directly from I/O pad 201 through selection circuit 212. Additionally, the root signal may come from clock 1 or 2 of the same PLL cell 218 or the PLL root may come from clock 1 of the neighboring PLL cell 218.

Finally, The root signal may come directly from the FPGA core through I/O cluster 222 when the PLL interjected FPGA clock signal is in turn selected to become the root and distributed over the clock network as the root signal. This process will be discussed in greater detail below. Thus, five signals may be chosen according to the user circuit to be the root signal for the clock tree network.

Figure 4:
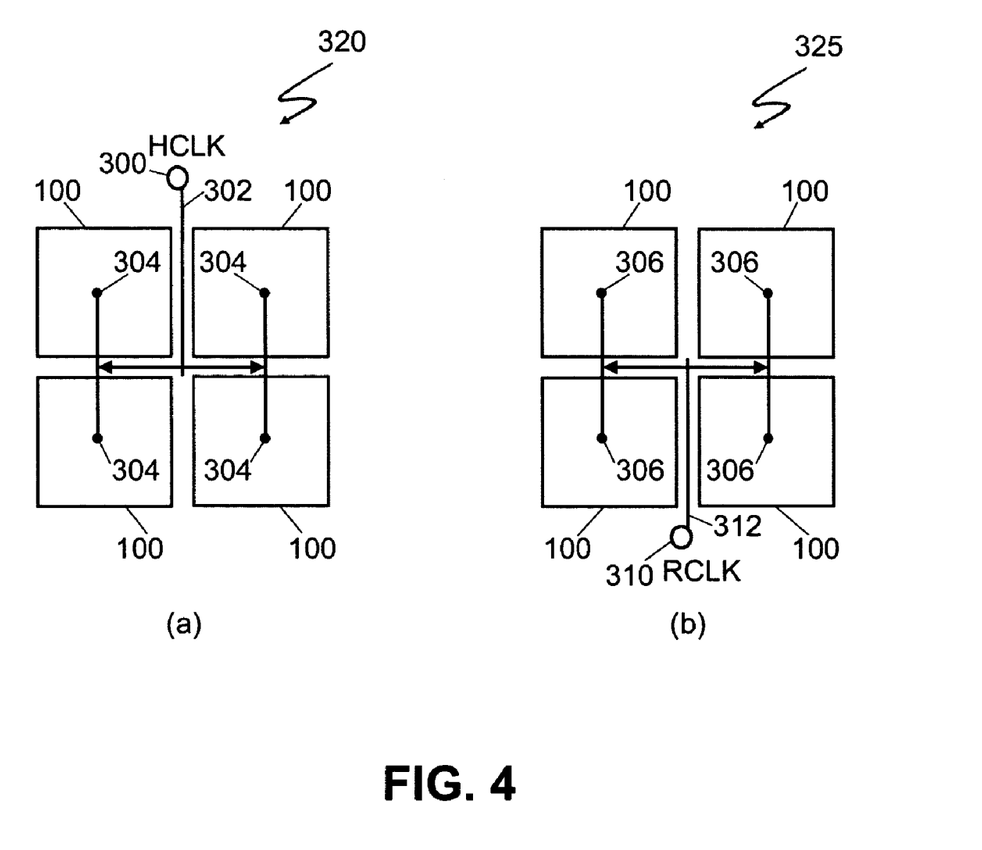
FIG. 4 is a simplified schematic diagram illustrating the hard-wired clock network and the routed clock network in an FPGA having four core tiles as shown in FIG. 2.

FIG. 4 is a simplified schematic diagram illustrating the hardwired clock network and the routed clock network in an FPGA having four core tiles as shown in FIG. 2. Hardwired clock tree network 320 comprises hardwired clock 300. The four hardwired clock networks originate from the four PLL block roots on the northern edge of FPGA core 10 as shown in FIG. 1. Hardwired clock tree network 320 distributes clock signals from the PLL root (clock) 300 through the clock network routing structure 302 to the root centers 304 of each FPGA core tile 100. Routed clock tree network 325 comprises routed clock 310. The four routed clock networks originate from the four PLL block roots on the southern edge of FPGA core 10 as shown in FIG. 1. Routed clock tree network 325 distributes clock signals from the PLL root (clock) 310 through the clock network routing structure 312 to the root centers 306 of each FPGA core tile 100.

Figure 5:
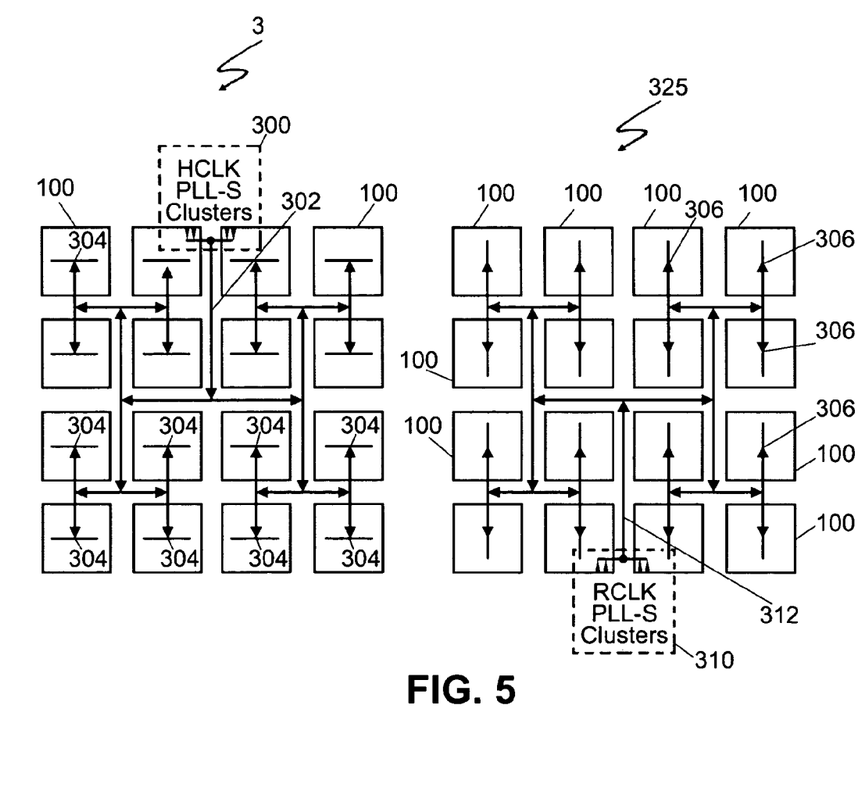
FIG. 5 is a simplified schematic diagram illustrating the hard-wired clock network and the routed clock network in an FPGA having sixteen core tiles.

FIG. 5 is a simplified schematic diagram illustrating the hard-wired clock network and the routed clock network in an FPGA having sixteen core tiles. Similar reference numerals are used to designate similar structures. Hardwired clock tree network 320 comprises hardwired clock 300. The four hardwired clock networks originate from the four PLL block roots on the northern edge of FPGA core 10 as shown in FIG. 1. Hardwired clock tree network 320 distributes clock signals from the PLL root (clock) 300 through the clock network routing structure 302 to the root centers 304 of each FPGA core tile 100. Routed clock tree network 325 comprises routed clock 310. The four routed clock networks originate from the four PLL block roots on the southern edge of FPGA core 10 as shown in FIG. 1. Routed clock tree network 325 distributes clock signals from the PLL root (clock) 310 through the clock network routing structure 312 to the root centers 306 of each FPGA core tile 100.

Figure 6:
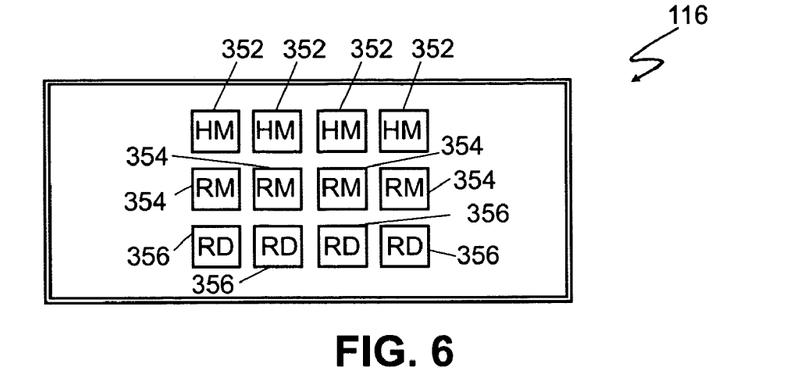
FIG. 6 is a simplified block diagram illustrating a clock tile cluster of FIG. 1.

FIG. 6 is a simplified block diagram illustrating a clock tile cluster 116 of FIG. 1. Clock tile cluster 116 is located in the center of each FPGA core tile 100 as shown in FIG. 1. Clock tile cluster 116 receives the signals from the PLL root (clock) 310 and will be discussed in greater detail below in reference to FIG. 7.

Clock tile cluster 116 comprises four hardwired clock distribution modules 352 and four routed clock distribution modules 354. Clock tile cluster 116 also comprises four routed clock modules 356. As will be discussed in greater detail below, routed clock modules 356 are included in clock tile cluster 116 due to its location within the column of routed clock clusters 112 as clearly seen in FIG. 1.

Figure 7:
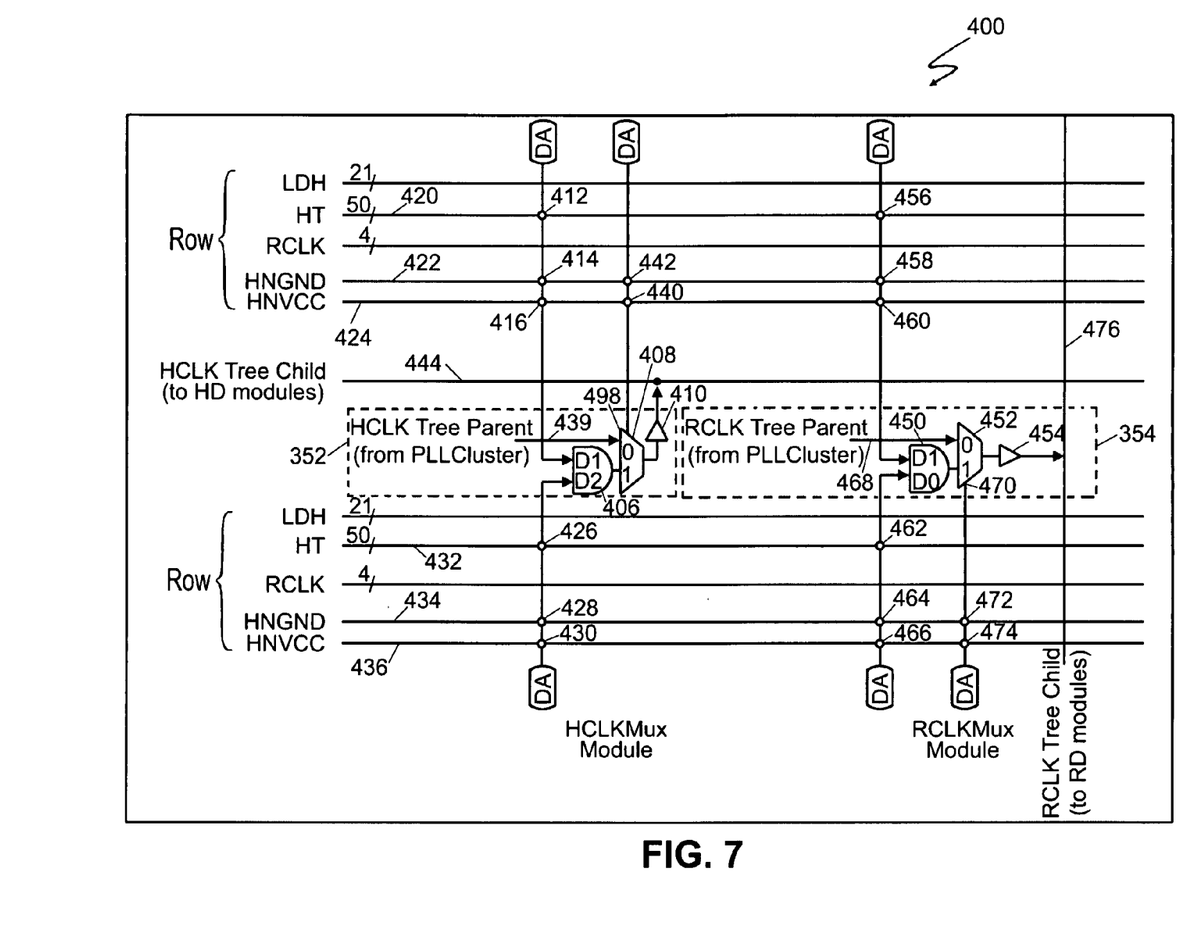
FIG. 7 is a simplified schematic diagram illustrating the hardwired clock modules and the routed clock modules of FIG. 6.

FIG. 7 is a simplified schematic diagram illustrating the hardwired clock distribution modules 352 and the routed clock distribution modules 354 of FIG. 6. Hardwired clock distribution module 352 comprises a two-input AND gate 406, two-input selection circuit 408 and a buffer 410. The first input of two-input AND gate 406 is programmably coupled through programmable elements 412, 416, 418 to horizontal track 420, ground 422 and Vcc 424 respectively in the row above clock tile cluster 400. In the present disclosure, Vcc is used to define the positive power supply for the digital circuit as designed. As one of ordinary skill in the art will readily recognize, the size of a digital circuit may vary greatly depending on a user's particular circuit requirements. Thus, Vcc may change depending on the size of the circuit elements used. The second input of two-input AND gate 406 is programmably coupled through programmable elements 426, 428, 430 to horizontal track 432, ground signal line 434 or Vcc signal line 436 respectively in the same row as clock tile cluster 400.

In this disclosure, various circuits and logical functions are described. It is to be understood that designations such as "1" and or "0" in these descriptions are arbitrary logical designations. In a first implementation of the invention, or "1" may correspond to a voltage high, while "0" corresponds to a voltage low or ground, while in a second implementation, "0" may correspond to a voltage high, while "1" corresponds to a voltage low or ground. Likewise, where signals are described, a "signal" as used in this disclosure may represent the application, or pulling "high" of a voltage to a node in a circuit where there was low or no voltage before, or it may represent the termination, or the bringing "low" of a voltage to the node, depending on the particular implementation of the invention.

The output of two-input AND gate 406 is coupled to one input of two-input selection circuit 408. The second input of two-input selection circuit 408 is coupled to PLL cluster 220 through PLL hardwired clock signal line 439 to receive the clock root signal from PLL cluster 220. Control input 438 of two-input selection circuit 408 is coupled to ground signal line 422 or Vcc signal line 424 respectively in the row above clock tile cluster 400 through programmable elements 442 and 440 respectively. The output of two-input selection circuit 408 is coupled to the input of buffer 410. Buffer 410 has an output coupled to hardwired clock signal line 444, which is coupled to hardwired clock clusters and will be explained in greater detail below.

Routed clock distribution module 354 comprises a two-input AND gate 450, two-input selection circuit 452 and a buffer 454. The first input of two-input AND gate 450 is programmably couplable through programmable elements 456, 458, 460 to horizontal track 420, ground 422 and Vcc 424 respectively in the row above clock tile cluster 400. The second input of two-input AND gate 450 is programmably couplable through programmable elements 462, 464, 466 to horizontal track 432, ground signal line 434 or Vcc signal line 436 respectively in the same row as clock tile cluster 400. The output of two-input AND gate 450 is coupled to one input of two-input selection circuit 452. The second input of two-input selection circuit 452 is coupled to routed clock signal line 468 the clock root signal from the PLL cluster 220, as shown in FIG. 3. Control input 470 of two-input selection circuit 452 is coupled to ground line 434 or Vcc signal line 436 in the same row as clock tile cluster 400 through programmable elements 472 and 474 respectively. The output of two-input selection circuit 452 is coupled to the input of buffer 454. Buffer 454 has an output coupled to routed clock signal line 476 which is coupled to routed clock clusters and will be explained in greater detail below.

Clock tile cluster 116 controls the tile level clock signals. For example, selection circuit 452 of routed clock distribution module 354 can select a signal from either the routed clock tree signal line 468 or AND gate 450. If selection circuit 452 selects routed clock tree signal line 468, then the routed clock tree signal is routed through to row clock distribution modules112. Selection circuit 452 can also select a local signal from horizontal track 432 in the same row if programmable element 462 is programmed and Vcc is chosen by programming programmable element 460 or from horizontal track 420 in the row above by programming programmable element 412 and Vcc is chosen by programming programmable element 430. Thus, routed clock distribution module 354 can send a local signal using the routed clock network and shut off the routed clock signal through that tile at the tile level. However, as will be discussed below, on the row level, each routed clock module 602 determines whether to choose a local signal to interject into the routed clock network or to shut off a particular row. Finally, if AND gate has one or both inputs tied to ground and selection circuit 452 chooses AND gate 450, then the clock tree signal line 476 to routed clock modules 354 is shut off to local or clock signals. Again, as will be discussed below, on the row level, each routed clock module 602 determines whether to choose a local signal to interject into the routed clock network or to shut off a particular row.

In the hardwired clock network, selection circuit 408 of hardwired clock distribution module 352 can select a signal from either the hardwired clock tree signal line 439 or AND gate 406. If selection circuit 408 selects hardwired clock tree signal line 439, then the hardwired clock tree signal is routed through to hardwired clock clusters 114. Selection circuit 408 can also select a local signal from horizontal track 432 in the same row as hardwired clock distribution module 352 if programmable element 426 is programmed and Vcc is chosen by programming programmable element 416. Additionally, selection circuit 408 can also select a local signal from horizontal track 420 in the row above hardwired clock distribution module 352 if programmable element 412 is programmed and Vcc is chosen by programming programmable element 430. Thus, hardwired clock distribution module 352 can send a local signal using the hardwired clock network and shut off the hardwired clock signal through that tile at the tile level. However, as will be discussed below, on the column level, each hardwired clock module 506 determines whether to choose a local signal to interject into the routed clock network or to shut off a particular column.

Finally, if AND gate 406 has one or both inputs tied to ground and selection circuit 408 chooses AND gate 406, then the clock tree signal line 444 to hardwired clock modules 506 is shut off to local or clock signals. Again, as will be discussed below, on the column level, each hardwired clock module 506 determines whether to choose a local signal to interject into the hardwired clock network or to shut off a particular column.

Figure 8:
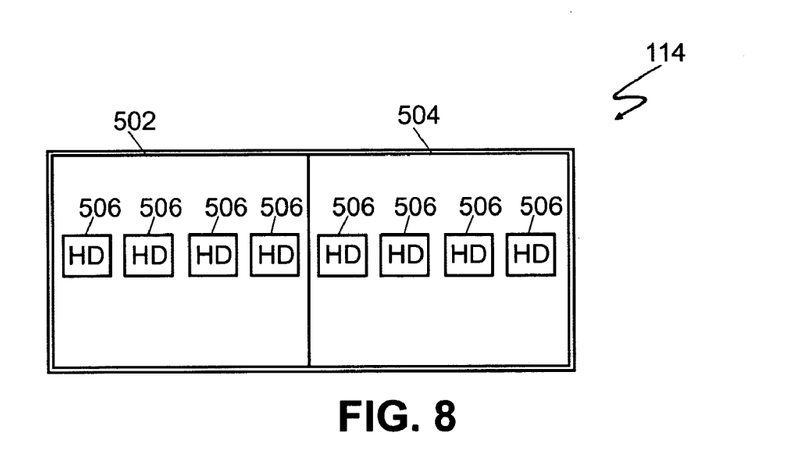
FIG. 8 is a simplified block diagram illustrating a hard-wired clock cluster of FIG. 1.

FIG. 8 is a simplified block diagram illustrating a hardwired clock cluster 114 of FIG. 1. Hardwired clock cluster 114 comprises two sub clusters 502 and 504. Each sub cluster 502 and 504 further comprise four hardwired clock modules 506. Hardwired clock modules 506 will be discussed in greater detail below.

Figure 9:
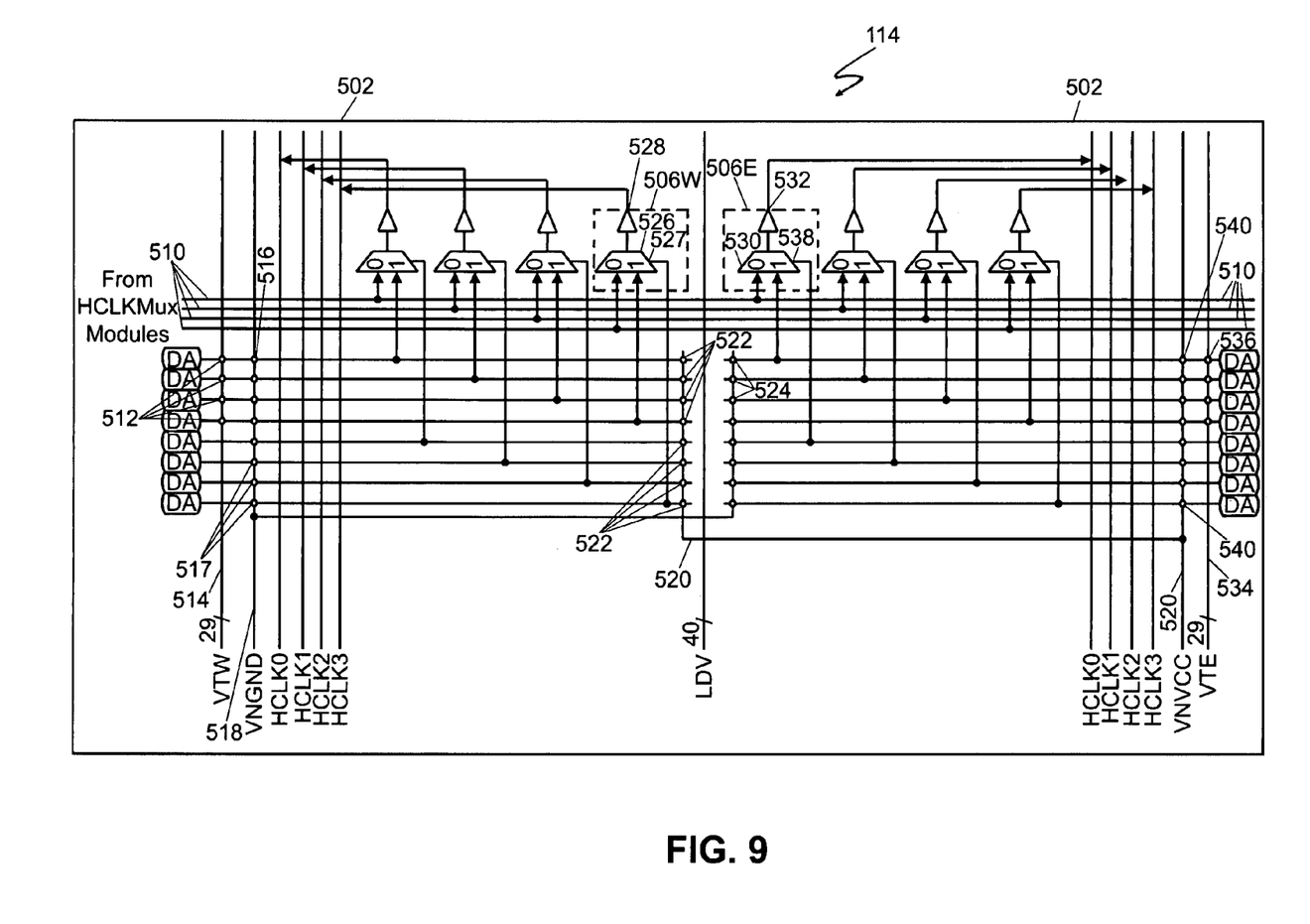
FIG. 9 is a simplified schematic diagram illustrating in further detail the hardwired clock cluster of FIG. 8.

FIG. 9 is a simplified schematic diagram illustrating in further detail the hardwired clock cluster 114 of FIG. 8. Similar reference numerals will be used to designate similar structures. Hardwired clock cluster 114 comprises two sub clusters 502 and 504. Sub cluster 502 comprises four hardwired clock modules 506. In one embodiment, hardwired clock modules 506 are identical and therefore the connections of only one will be discussed herein. Hardwired clock module 506 in sub cluster 502 comprises a two-input selection circuit 526 and a buffer 528. Two-input selection circuit 526 has a first input coupled to hardwired clock signal line 510. Hardwired clock signal line originates from PLL cluster 220 as set forth above. A second input of two-input selection circuit 526 is coupled to vertical track west 514 through programmable elements 512. Thus, two-input selection circuit 526 may either receive a signal from hardwired clock signal line 510 or vertical track 514. Control input 527 is coupled to ground 518 through programmable elements 516 or Vcc 520 through programmable elements 522. The output of two-input selection circuit 526 is coupled to the input of buffer 528. The output of buffer 528 is coupled to a clock signal line 0 through 3 coinciding with hardwired clock modules 1 through 4. Clock signal lines 0 through 3 provide the signals to all flip-flops (not shown) in logic clusters 110 and I/O clusters 104 in the FPGA core tile 100 as shown in FIG. 1.

Sub cluster 504 comprises four hardwired clock modules 506E. In one embodiment, hardwired clock modules 506E are identical and therefore the connections of only one will be discussed herein. Hardwired clock module 506E in sub cluster 502 comprises a two-input selection circuit 530 and a buffer 532. Two-input selection circuit 530 has a first input coupled to hardwired clock signal line 510. Hardwired clock signal line originates from PLL cluster 220 as set forth above. A second input of two-input selection circuit 530 is coupled to vertical track west 534 through programmable elements 536. Thus, two-input selection circuit 530 may either receive a signal from hardwired clock signal line 510 or vertical track 534. Control input 538 is coupled to ground 518 through programmable elements 524 or Vcc 520 through programmable elements 540. The output of two-input selection circuit 530 is coupled to the input of buffer 532. The output of buffer 532 is coupled to a clock signal line 0 through 3 coinciding with hardwired clock modules 1 through 4. Clock signal lines 0 through 3 provide the signals to all flip-flops (not shown) in logic clusters 110 and I/O clusters 104 in the FPGA core tile 100 as shown in FIG. 1.

Hardwired clock modules 506W can be programmed to select a clock signal from hardwired clock signal line 510 from the parent clock tree or to select a local signal from a vertical track or to shut down the column signal line at the column level. For example, to select the clock signal, selection circuit 526 selects the clock signal line 510 and sends the clock signal to all flip-flops in the FPGA tile column. To interject a local signal, selection circuit selects vertical track 514 by programming programmable element 512 and 516 and a localized clock domain is created. To shut down the clock network at the column level, selection circuit 526 can select either ground 518 or Vcc 520 by programming programmable elements 517 or 522 respectively to create a static signal. The programming is substantially the same in hardwired clock modules 506E.

Figure 10:
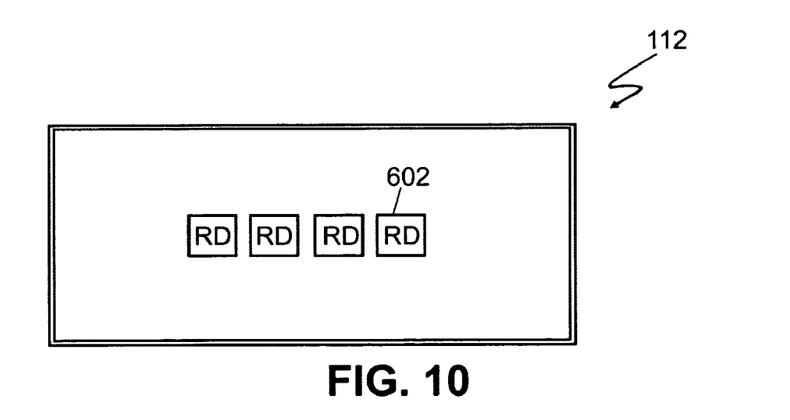
FIG. 10 is a simplified block diagram illustrating a routed clock cluster of FIG. 1.

FIG. 10 is a simplified block diagram illustrating a routed clock cluster 112 of FIG. 1. Routed clock cluster 112 comprises four routed clock modules 602. Routed clock clusters 112 comprise a column of clusters located in the center of FPGA core tile 100 as shown in FIG. 1. Routed clock clusters 112 supply the clock signals to all the combinatorial logic in FPGA core tile 100.

Figure 11:
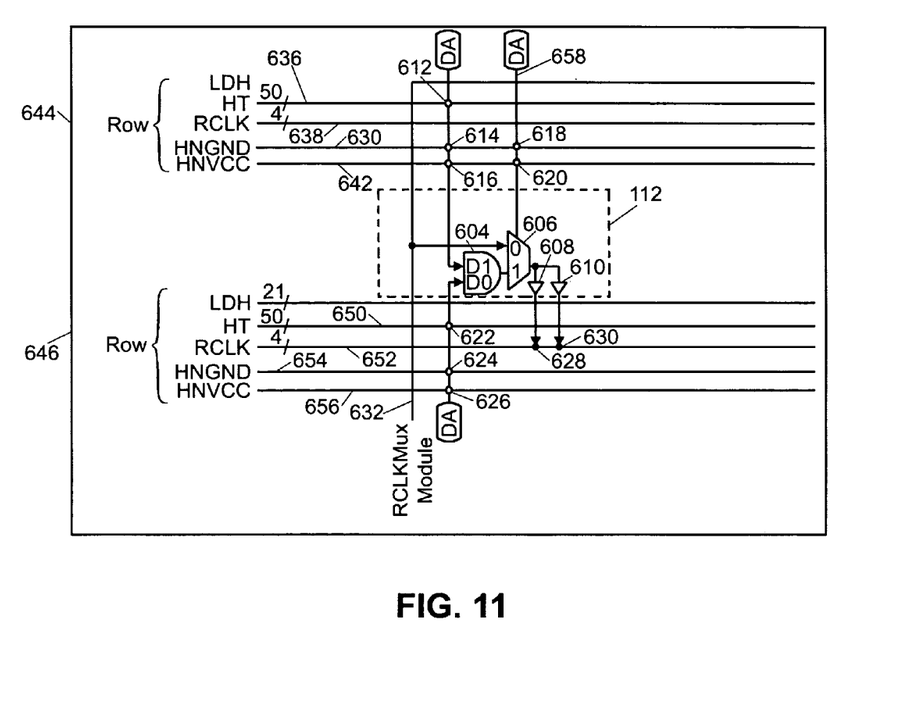
FIG. 11 is a simplified schematic diagram illustrating in further detail the routed clock cluster of FIG. 10.

FIG. 11 is a simplified schematic diagram illustrating in further detail the routed clock module 602 of FIG. 10. Routed clock module 602 comprises a two-input AND gate 604 with a first input coupled to either horizontal track 636 through programmable element 612, ground signal line 640 through programmable element 614 or Vcc signal line 642 through programmable element 616 in row 644 above routed clock module 602. Two-input AND gate 604 has a second input coupled to either horizontal track 650 through programmable element 622, ground signal line 654 through programmable element 624 or Vcc signal line 656 through programmable element 626 in the same row 646 as routed clock module 602.

Two-input AND gate 604 has an output coupled to an input of two-input selection circuit 606. The second input of two-input selection circuit 606 is coupled to the output signal line 632 of routed clock distribution module 354 as shown in FIG. 7. Two-input selection circuit 606 has a control line 658 coupled to either ground signal line 640 through programmable element 618 or Vcc signal line 642 through programmable element 620. Thus, selection circuit 606 can either choose a signal from the routed clock distribution module 354 or from horizontal track 636 in the row above routed clock module 602 or horizontal track 650 in the same row as routed clock module 602 and route the signal into the routed clock network via routed clock signal line 652 through buffers 608 and 610.

For example, routed clock distribution module 354 can be programmed to select a clock signal from routed clock signal line 632 by programming selection circuit 606 to select the clock signal line 632 and sending the clock signal to all logic modules in the FPGA tile row. To interject a local signal, selection circuit 606 selects AND gate 604. To interject a signal from the row 644 above routed clock module 602, element 612 is programmed to route a local signal from horizontal track 636 and the second input is programmed to Vcc by programming programmable element 626. To interject a signal from the same row 646 as routed clock module 602, element 622 is programmed to route a local signal from horizontal track 650 and the second input is programmed to Vcc by programming programmable element 616.

To shut down the routed clock network at the row level, selection circuit 526 can select AND gate 604 which has inputs tied either ground 642 in the row 644 above routed clock distribution module 354 or ground 654 in the same row 646 as routed clock distribution module 354 by programming programmable elements 612 or 622 respectively. As would be apparent to one of ordinary skill in the art, one can shut off the routed clock network by programming the programmable elements to Vcc and creating a static condition.

As set forth above, the first section of the clock network is from the PLL root to the centers of all the tiles in a chip. The path between the root and the centers of each tile is designed to produce the minimum skew and shortest latency. The chip level clock network design may vary depending on the tile array and organization. However, the chip level clock networks of both the hardwired clock network and the routed clock network are the same but mirror along the east-west axis of the chip. The second section of the clock network distribution of the present invention starts from the center of a tile to a selected set of inputs of the logic clusters.

It should be understood that various alternatives to the embodiments of the disclosed method and apparatus described herein maybe employed in practicing the disclosed method and using the disclosed apparatus. It is intended that the following claims define the scope of the disclosed method and apparatus and that methods and structures within the scope of these claims and their equivalents be covered thereby.

The invention claimed is:

1. A clock tree distribution network for a field programmable gate array (FPGA) comprising:
  an interface having a root signal selected from at least one of an external clock signal, an internal clock signal and a plurality of phase lock loop cell output signals, said interface having programmable elements;
  a logic array having a plurality of local signals and having programmable elements;
  a programmable routing architecture coupled to said programmable elements of said interface and said logic array;
  a routed clock network that selects a signal from at least one of said root signal, a local signal from said logic array, a positive power supply signal, and a ground signal and routes said selected signal to at least one of a plurality of logic modules and a plurality of flip-flops in said logic array; and
  a hardwired clock network that selects a signal from at least one of said root signal, a local signal from said logic array, a positive power supply signal, and a ground signal and routes said selected signal to said plurality of flip-flops in said logic array.

2. The clock tree distribution network according to claim 1 further comprising:
  a clock tile distribution cluster having a hardwired clock distribution module configured to receive said root signal for said hardwired clock network and a routed clock distribution module configured to receive said root signal for said routed clock network.

3. The clock tree distribution network according to claim 2 wherein said clock tile distribution cluster further comprises a plurality of routed clock modules, said modules comprising logic components programmed to select route one of a clock signal, a local signal, a positive power supply signal and a ground signal.

4. The clock tree distribution network according to claim 2 wherein said clock tile distribution cluster further comprises a plurality of hardwired clock modules, said hardwired clock modules comprising logic components programmed to select route one of a clock signal, a local signal, a positive power supply signal and a ground signal.

5. The clock tree distribution network according to claim 2 wherein said routed clock network comprises a plurality of routed clock clusters arranged in a column in said logic array and programmably coupled to said routed clock distribution module in said clock tile distribution cluster.

6. The clock tree distribution network according to claim 5 wherein said routed clock clusters further comprises a plurality of routed clock modules, said modules comprising logic components programmed to select and route one of a clock signal, a local signal from said routing architecture, a positive power supply signal and a ground signal.

7. The clock tree distribution network according to claim 2 wherein said hardwired clock network comprises a plurality of hardwired clock clusters arranged in a row in said logic array and programmably coupled to said hardwired clock distribution module in said clock tile distribution cluster.

8. The clock tree distribution network according to claim 7 wherein said hardwired clock clusters further comprises a plurality of hardwired clock modules, said hardwired clock modules comprising logic components programmed to select and route one of a clock signal, a local signal, a positive power supply signal and a ground signal.

* * * * *